United States Patent [19]

Fergason et al.

[11] 3,996,517
[45] Dec. 7, 1976

[54] APPARATUS FOR WAFER PROBING HAVING SURFACE LEVEL SENSING

[75] Inventors: Lewis A. Fergason, O'Fallon; David R. Turnbull, Edmundson, both of Mo.

[73] Assignee: Monsanto Company, St. Louis, Mo.

[22] Filed: Dec. 29, 1975

[21] Appl. No.: 645,175

[52] U.S. Cl. .......................... 324/158 P; 324/72.5; 324/158 F; 324/73 R; 324/73 AT
[51] Int. Cl.² ...................................... G01R 31/02
[58] Field of Search ......... 324/73 AT, 73 R, 158 F, 324/158 P, 72.5; 269/55

[56] References Cited

UNITED STATES PATENTS

| | | | |
|---|---|---|---|
| 3,500,192 | 3/1970 | Donaher et al. | 324/72.5 |
| 3,702,439 | 11/1972 | McGahey et al. | 324/158 P |
| 3,866,119 | 2/1975 | Ardezzone et al. | 324/158 F |
| 3,936,743 | 2/1976 | Roch | 324/158 F |

*Primary Examiner*—Robert Segal
*Assistant Examiner*—Vincent J. Sunderdick
*Attorney, Agent, or Firm*—Peter S. Gilster

[57] ABSTRACT

Disclosed is a method and apparatus to improve the capabilities of automatic and semi-automatic diode, integrated chip, and wafer probers. Prober contact with the upper surface of the wafer to be tested is accomplished through an electronic logic circuit triggered by electrical contact of the probe as opposed to a mechanical sensor. This improved surface position signal is supplied to additional digital logic circuitry to operate a vertical axis control mechanism which precisely locates the probes relative to the wafers that will be tested. Thus, prober contacts with test wafers are positively and accurately made improving the reliability of the test stage of wafer production.

7 Claims, 4 Drawing Figures

APPARATUS FOR WAFER PROBING HAVING SURFACE LEVEL SENSING

BACKGROUND OF THE INVENTION

The invention relates to a method and apparatus for testing electronically discrete devices such as light-emitting diodes while still in the wafer form. Autoprobers, as the test machines are called, normally mark the defective electronic devices in some manner, usually with a solenoid operated inker of some variety, which are later discarded. The usual sequence of events is for a vacuum chuck on which the wafer to be tested is mounted, is raised up in the vertical or Z axis under the influence of a pneumatic cylinder or solenoid. The device to be tested, hereinafter referred to as a die, is electrically connected through a number of spring-loaded needle-like probes to an automatic test sequencer. A surface sensor also makes contact with the wafer surface, opens a microswitch and via digital logic circuitry provides the signal for the tester to begin its test sequence. Attached to the chuck normally is a metal flag which interrupts a beam of light between a light emitter and a detector when the chuck is in the up position to provide a second signal necessary to start the testing apparatus. Some probers only require the surface sensing, others require both surface and the chuck up signal prior to initiation of the test sequences. The test sequences are developed in an apparatus external to the autoprober and, through electrical connections to the probe support ring and the individual probes, are applied to the die whose response to the test sequence is also monitored and compared with known or desired responses. If a defective die is found, it is marked accordingly and discarded during the later processing which cuts up the wafer and separates the numerous dies printed on its surface.

Upon completion of the test series, an end-of-test (EOT) signal causes the vacuum chuck to drop to its lower limit allowing indexing in the X and Y axes to the next die printed on the wafer at which point the complete autoprober sequence is initiated again.

Many autoprobers have only a manual Z axis adjustment which requires an operator to monitor with percision the height of the vacuum chuck when it comes up. A problem if it is not up far enough or if it is up too high is that the inkers which are supposed to leave a 5, 10 or 15 mil. ink dot may leave a much smaller dot than they are supposed to or may obliterate the chip completely be leaving too large an ink dot. The result is that some defective dies might not be discarded because the ink dot is so small as not to be noticable or other dies adjacent to a defective die might also become covered with ink in the event that the ink dot is too large. An additional problem emphasizing the criticality of the Z axis adjustment is that it is desirable for the needle-ended probers to actually penetrate the contact surfaces slightly. In die construction it is common to use a vapor-deposited aluminum coating as an electrical connection contact; however, it is well known that an aluminum oxide coating can form on the outside of such a metallized contact making a low resistance contact extremely difficult. It is thus desirable for the needle point to penetrate the aluminum oxide to the non-oxidized aluminum coating without penetrating so far through that the complete die is destroyed. This then requires a very narrow operating range in the Z axis direction. Therefore, it is extremely desirable to maintain a precise Z axis orientation each time the chuck is in its pneumatic or solenoid operated up position.

In the past, numerous extremely complicated and expensive devices have been used to provide Z axis control such as a laser beam impinging upon the wafer and then the phase relationship of the reflected beam compared to the initial beam by a computer such that a precise vertical orientation is determined. Unfortunately, methods of this sort are extremely expensive and are economically prohibited from application in the smaller automatic and semi-automatic autoprobers. Therefore, many of the common prior-art autoprobers, such as the Electroglass model 1032 semi-automatic prober/inspector from Electroglass Inc. in Menlo Park, California, utilize a mechanical microswitch to sense the Z axis position of the surface of the wafer. The problems associated with such a mechanical switch are well known; for example, thermal effects, electronic noise, mechanical wear, etc. Therefore, elimination of the mechanical surface sensing device would allow a more accurate determination of the Z axis position.

SUMMARY OF THE INVENTION

It is, therefore, an object of the present invention to provide an electronic surface level sensing of the wafers as they are moved in the Z axis direction.

It is a further object of the instant invention to provide an automatic Z axis control which will vary the probe positions to maintian a constant probe pressure on the surface of an irregularly surfaced wafer.

A still further object of the instant invention is to provide an improved surface level sensing and Z axis control mechanism that is adaptable to the existing prior-art autoprobers.

According to the present invention, the foregoing and other objects are attained by electrically sensing the contact of the prober needle with the surface of the die using logic circuits to generate a pulse to a control relay which disconnects the surface level sensor from the probe and attaches the correct electronic testing connection to that probe. The Z axis control is achieved by comparing the electronic surface sensing pulse with the occurrence of the chuck up pulse such that the first one to reach its respective monostable multivibrator controls the polarity of the Z axis adjustment and the time-wise difference controls the magnitude of the Z axis correction. The correction or error signal is then transmitted to a stepping motor control circuit which operates a probe ring height adjustment in the Z axis.

DETAILED DESCRIPTION OF THE PREFERRED EMBODIMENT

Figure 1:
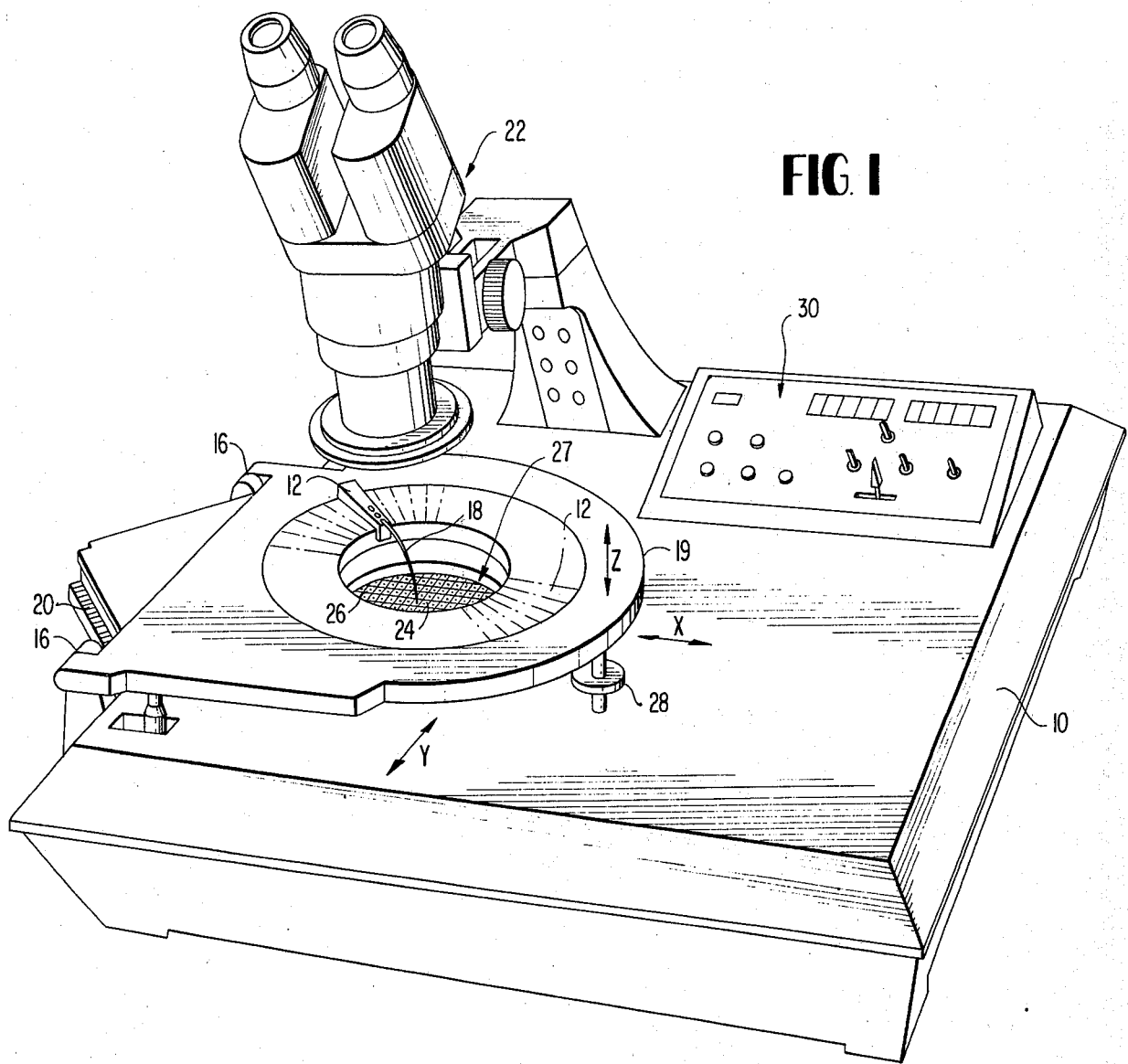
FIG. 1 is a perspective view of a typical autoprober.

Referring now to the drawings wherein like reference numerals designate identical parts throughout the several views, and more particularly to FIG. 1 wherein there is depicted a typical semi-automatic prober/inspector. A housing 10 contains the X and Y axis stepping motors in addition to the electronic control circuitry for the pneumatic or electrical Z axis operation (not shown). Probe mounts 12 are carried on a probe support ring 14 which is movable in the vertical or Z axis as shown through pivots 16. Individual probes 18 are mounted around the support ring (all but one have been excluded for clarity of understanding) and are electrically connected to one of the numerous electrical contacts 20. Microscope 22 allows an operator to view the alignment of probes on the individual dies 24 printed on wafer 26 which is mounted on vacuum chuck 27. The Z axis adjustment 28 allows the operator to vary the Z axis position manually while controlling the X and Y positioning sequence of the chuck electrically through control panel 30.

Figure 2:
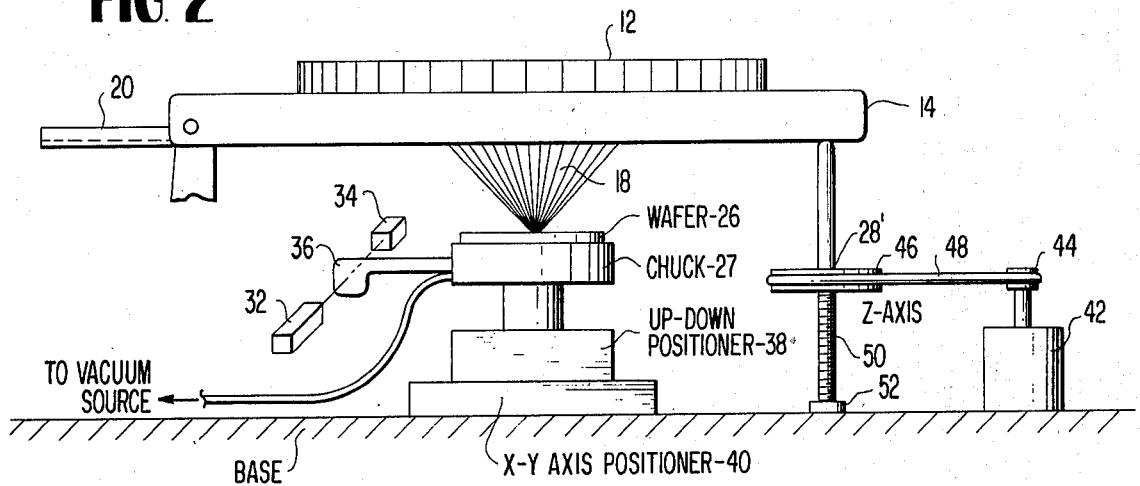
FIG. 2 is a schematic side view of the physical controls utilized in autoprober operation.

FIG. 2 is a partially cut-away side view showing the details of the modified autoprober. The chuck up signal is provided by the interruption of light from light emitter 32 upon detector 34 by flag 36 therebetween when chuck 27 is in the full up position as controlled by up-down positioner 38. The stepping from die to die on the surface of wafer 26 is controlled by the XY axis positioner 40 while wafer 26 is firmly retained in vacuum chuck 27. The Z axis adjustment of the probe support ring 14 is controlled by the rotation of Z axis adjustment 28' as controlled by stepping motor 42 through pulleys 44 and 46 and belt 48. Rotation of Z axis adjustment 28' will rotate threaded shaft 50 moving the shaft up and down through nut 52. Thus, depending upon the rotation of stepping motor 42, the support ring 14 will be moved either up or down in the Z axis direction.

Figure 3:
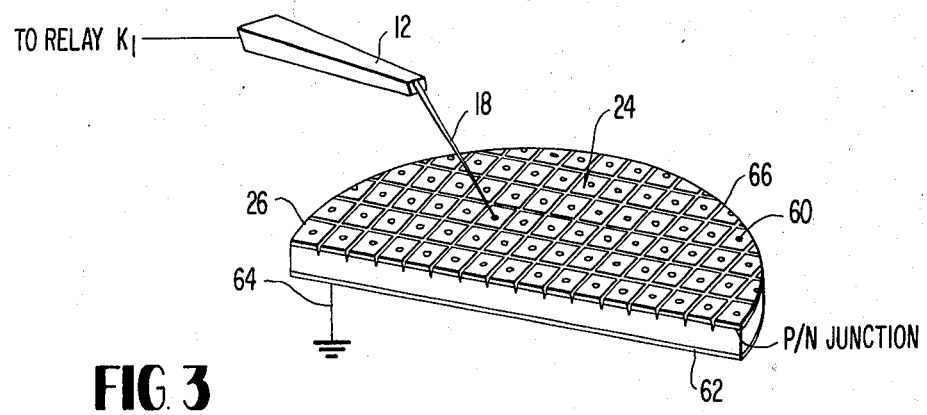
FIG. 3 is a top view of typical probe/die interface.

FIG. 3 is a close-up view of the probe contacting the die printed on the wafer disc 26. The metallized areas 60 are deposited on the wafer surface 26 above the P/N junction to provide an electrical contact with the diode. The other contact is provided by the layer of metal 62 on the lower side of the wafer which is grounded through electrical connector 64. The individual dies are separated by etching or sawing grooves 66 into the upper surface of the wafer. Obviously, instead of a simple diode, the circuit on the wafer could be a complex, microscopic integrated circuit with numerous test contacts requiring multiple probes with which to apply the necessary test sequences, but no mater how many probes are utilized, one probe needle 18 is electrically connected to the surface level sensor and is grounded upon contacting the wafer surface.

Figure 4:
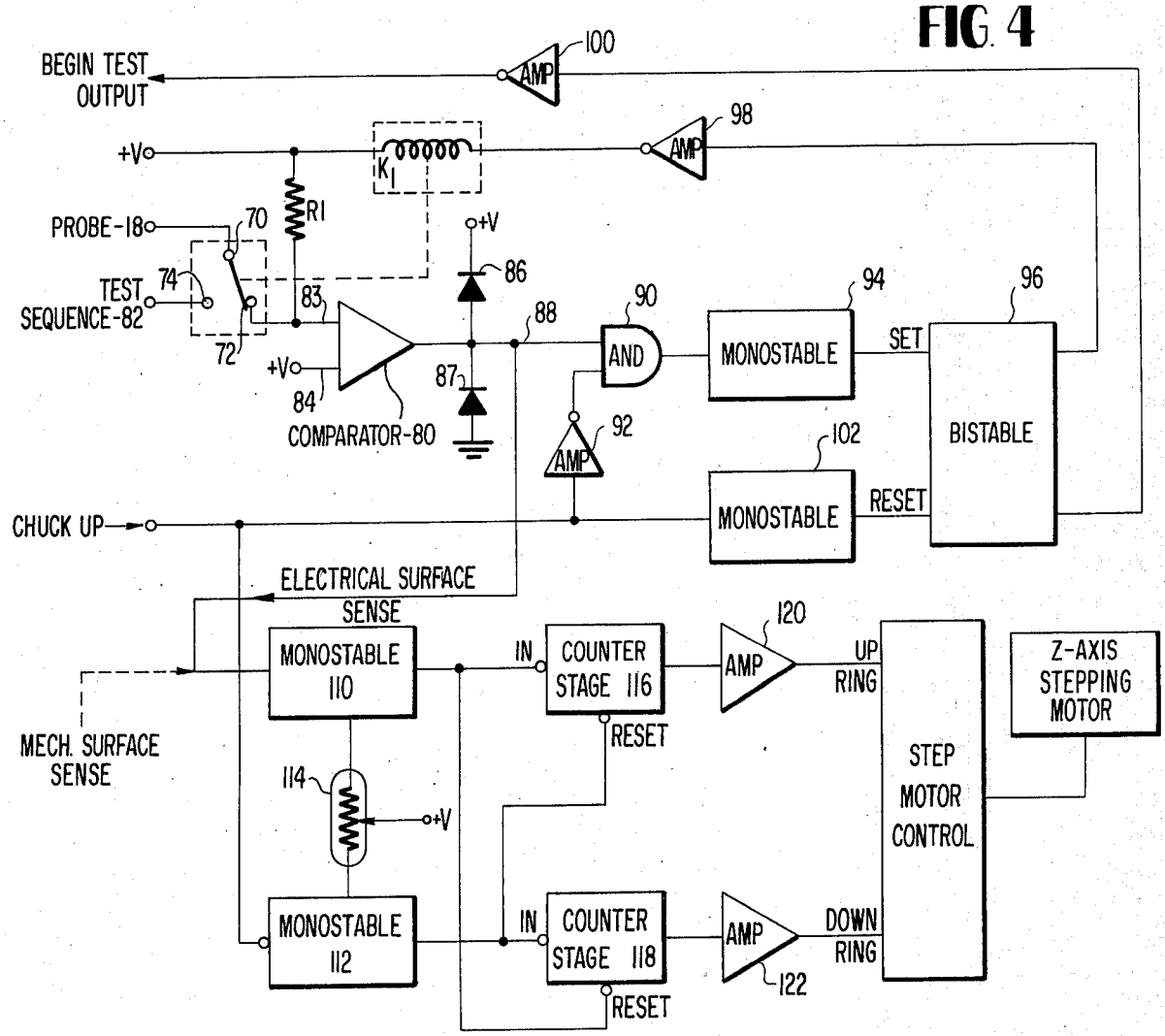
FIG. 4 is an electrical schematic of the logic circuit of the instant invention.

FIG. 4 shows the details of the digital logic circuit which provides surface level sensing and the Z axis control. Shown in the inactivated state, relay Kl has contacts 70 and 72 which connect the probe 18 to an input 83 of comparator 80. The other input 84 of comparator 80 is connected to a reference voltage. During its energized state, relay Kl forces connection to be made between contacts 70 and 74 applying the test sequence input 82 to probe 18. As can be seen, with relay Kl inactivated and until probe 18 contacts the electrical wafer, both inputs to comparator 80 will be at the same reference voltage V and thus there will be no output. However, when the probe is grounded to a die, the voltage on input of comparator 80 is reduced resulting in an output from comparator 80. This output of comparator 80 is clamped to a specific voltage range by clamping diodes 86 and 87 with the result that at point 88 an electrical indication of surface level sensing is present. This is fed both to the Z axis control circuit and into an AND-logic element 90 whose other input is supplied by inverting the negative going chuck up signal through inverting aplifier 92. Only when two positive inputs are supplied to AND-logic element 90 is there an output supplied to the monostable multivibrator 94. This sets bistable multivibrator 96 such that inverting amplifier 98 supplies an output energizing the coil of relay Kl. This causes an opening between contacts 70 and 72 and a short between contacts 70 and 74 thus electrically connecting the probe to its test sequencer 82. Coincidental with actuation of relay Kl, bistable multivibrator 96 also supplies an output which is inverted through inverting 100 which provides a begin test output to the automatic test sequencer. Thus, it can be seen that once the surface of a die has been reached and sensed electrically by a probe, the probe is thereafter disconnected from the sensing circuit and connected to its proper testing circuit. When the test sequence has been completed, the testing apparatus (not shown) transmits a signal to the up-down positioner 38, as shown in FIG. 2, to begin lowering the chuck preparatory to indexing in the X and/or Y direction. As soon as the flag mounted on the chuck is moved out of alignment between the emitter and detector, a positive pulse is generated by the detector. This pulse is transmitted through monostable multivibrator 102 to the reset terminal of bistable multivibrator 96, thereby terminating the energizing current through the coil of relay Kl allowing the probe 18 to be reconnected to the sensing circuit and disconnected from its individual test circuit. Similarly, the begin test output of the bistable multivibrator 96 is terminated, and the surface level sensing apparatus is reset until the chuck is raised in the next cycle.

In a preferred embodiment, the surface level sensing signal is also transmitted from point 88 to monostable multivibrator 110 in the Z axis controller, although this input could also be from a mechanical surface sensing device such as a microswitch (not shown) in other embodiments. The chuck up signal is supplied to an inverting monostable multivibrator 112 whose pulse-width control potentiometer 114 is shared with monostable multivibrator 110. By adjustment of potentiometer 114 the ratio of the pulse duration between the monostable multivibrators 110 and 112 can be adjusted. The output of monostable vibrator 110 is supplied to the input of counter stage 116 (a symmetrically triggered bistable multivibrator) and to the reset of counter stage 118. Similarly, the output of monostable multivibrator 112 is supplied to the input of counter stage 118 and the reset of counter stage 116. The outputs of counter stages 116 and 118 are supplied to amplifiers 120 and 122, respectively. The amplified outputs are then supplied to the step motor controller which, depending on which amplifier supplies the output, operates the Z axis motor in the appropriate direction.

The operation of the Z axis control will now be described. The difference in input times to monostable multivibrators 110 and 112 is reflected in the trailing edges of their positive output pulses. As indicated in FIG. 4, the inputs and resets of the counter stages are triggered by a zero signal (through the inverted input and reset) such that the negative going trailing edge of the positive pulse triggers one counter stage and resets the other. Other embodiments could have counters triggered by positive going pulses without deviating from the applicant's disclosed concept. If the surface sensing signal is generated prior to the chuck up signal, the pulse output from monostable multivibrator 110 will precede the pulse output of monostable multivibrator 112 if their pulse durations are similar. Therefore, counter stage 116 will be triggered, while at the same time counter stage 118 will be reset. A short time later, the pulse output of one-shot multivibrator 112 will reset counter stage 116 such that its time duration of output is directly proportional to the time difference between the outputs of monostable multivibrators 110 and 112. Counter stage 118 is not triggered by the output of monostable 112 because it is inhibited by output of monostable multivibrator 110. Therefore, the only output from the two counter stages is from counter stage 116 which is amplified 120 and applied to the step motor controller. It can be seen that the application of the output of amplifier 120 to the step motor controller will cause the stepping motor to raise the probe ring which would tend to delay probe contact with the die, thereby delaying the electrical contact and thus reducing the time difference between the surface sensing and the chuck up signal. A similar analysis can be made for the case where the chuck up signal is produced prior to the generation of the surface sensing signal with the result that the probe ring is lowered, speeding up the contact point again reducing the time difference.

Because it is desirable to have the individual probe points actually pierce any oxide coating on the metallic contacts, a certain pressure on the spring-loaded probes is required. This pressure is achieved by allowing contact to be made slightly before the chuck terminates its vertical Z axis motion, i.e., slightly before the chuck up signal. To adjust the trailing edges of monostable multivibrators 110 and 112 such that there is no error signal when the surface sensing leads the chuck up signal by a predetermined amount, the potentiometer 114 is adjusted to lengthen the pulse width of monostable multivibrator 110 and shorten the pulse width of monostable multivibrator 112. Thus, if the surface sense signal leads the chuck up signal by the exact amount that the pulse width of monostable multivibrator 110 exceeds the pulse width of monostable multivibrator 112, there will be a zero error signal developed in counter stages 116 and 118 because both negative going trailing edges will occur simultaneously and thus the Z axis stepping motor will not be actuated by the step motor controller. Conversely, by changing potentiometer 114 the difference in the output timing of multivibrators 110 and 112 and thus the pressure developed on the probe tips, can be varied to take into account different coatings, metallic oxides, etc.

It can be seen by one skilled in the art that there are numerous variations in logic circuitry that will achieve the above disclosed results. For example, the use of printed circuits or integrated chips would allow inclusion of the circuitry into existing autoprobers as a mere modification. Similarly, mechanical surface sensing while not as accurate as the disclosed electrical surface sensing would still allow the use of the automated Z axis control system. Obviously, numerous other modifications and variations of the present invention are possible in the light of the above teachings. It is therefore to be understood that within the scope of the appended claims the invention may be practiced otherwise than as specifically described therein.

What is claimed is:

1. In an apparatus for applying a predetermined electrical test sequence from a test sequencer to semiconductor devices on wafers, said apparatus including a chuck for mounting said wafers, at least one probe to make electrical contact with one of said semiconductor devices, said chuck being capable of periodically moving toward and away from said probe while moving in a predetermined sequence transversely with respect to said probe such that said probe makes contact sequentially with all of said semiconductor devices located on said wafer, said chuck providing a chuck up signal when it is in its closest proximity to said probe, said apparatus including surface sensing means for providing a surface sense signal when said probe contacts said semiconductor device, the improvement comprising:
   Z-axis adjustment means for varying the distance between said probe and said chuck;
   time comparator means for electrically comparing the time of occurence between said chuck up signal and said surface sense signal and providing an output whose magnitude is proportional to the time difference between the signals and whose polarity reflects which signal was first applied to said time comparator means;
   controller means, responsive to the output of said time comparator means, for moving said adjustment means in response to signals from said time comparator means such that said probe is moved closer to said chuck if the chuck up signal precedes the surface sense signal and said probe is moved further away from the chuck if said surface sense signal precedes the chuck up signal, said movement being proportional to the difference in time between said signals.

2. The apparatus of claim 1, wherein said time comparator means includes a variable time delay means through which said signals pass prior to said comparing of signals such that when said delay time of one signal is increased the delay time of the other signal is decreased.

3. The apparatus of claim 1, wherein said time comparator means comprises:
   first and second monostable multivibrators responsive to said surface sense signal and said chuck up signal, respectively, and producing pulse outputs;
   first and second counter stages each having an input, an output and a reset, said input of each counter stage responsive to the output of the corresponding monostable multivibrator and to the reset of the other counter stage; and
   first and second amplifiers, each providing an output in response to the output of the corresponding counter stage.

4. The apparatus of claim 3, wherein said controller means is comprised of:
   Z-axis controlling means responsive to said first and second of said amplifiers for producing an output whose polarity and duration are proportional to the difference in time between said signals; and
   Z-axis stepping motor means responsive to said output of said Z-axis controller means for operating said Z-axis adjustment means and varying the distance between said probe and said chuck.

5. The apparatus of claim 4, wherein said surface sensing means is comprised of:
   microswitch means capable of producing an electrical output signal; and
   probe means connected to said microswitch means such that when the probe contacts said semiconductor device, said microswitch means provides an output signal.

6. the apparatus of claim 4, wherein said surface sensing means is comprised of:
 a relay with an energized position and a de-energized position, having a central terminal, a de-energized terminal, an energized terminal and an energizing coil, said central terminal being electrically connected to said probe, said energized terminal being connected to said test sequencer;
 a voltage comparator having first and second inputs and an output, said first input connected to a reference voltage, said second input being connected through a voltage dropping resistor to said reference voltage, said second input also connected to said de-energized terminal of said relay such that said probe is connected through said voltage dropping relay to said reference voltage when said relay is in the de-energized position;
 a clamp circuit means connected to the output of said voltage comparator to maintian said output between precise limits;
 an AND-logic element having two inputs and an output, one of said inputs being connected to the output of said voltage comparator and the other of said inputs being connected to receive said chuck up signal;
 a third monostable multivibrator responsive to the output of said AND-logic element for generating a pulse output of a predetermined duration;
 a bistable multivibrator having a set input, a reset input and two outputs, said set input responsive to the output of said third monostable multivibrator;
 first means, responsive to one of said bistable multivibrator outputs, for applying an energizing output through said relay coil;
 second means responsive to the other of said bistable multivibrator outputs, for providing an output to said test sequencer;
 a fourth monostable multivibrator responsive to said chuck up signal for generating a pulse to reset said bistable multivibrator.

7. In an apparatus for applying a predetermined electrical test sequence from a test sequencer to semiconductor devices on wafers, said apparatus including a chuck for mounting said wafers, at least one probe to make electrical contact with one of said semiconductor devices, said chuck being capable of periodically moving toward and away from said probe while moving in a predetermined sequence transversely with respect to said probe such that said probe makes contact sequentially with all of said semiconductor devices located on said wafer, said chuck providing a chuck up signal when it is in its closest proximity to said probe, the improvement comprising an electronic surface sensing means for providing a surface sense signal when said probe contacts said semiconductor device wherein said surface sensing means comprising:
 a relay with an energized position and a de-energized positon, having a central terminal, a de-energized terminal, an energized terminal and an energizing coil, said central terminal being electrically connected to said probe, said energized terminal being connected to said test sequencer;
 a voltage comparator having first and second inputs and an output, said first input connected to a reference voltage, said second input being connected through a voltage dropping resistor to said reference voltage, said second input also connected to said de-energized terminal of said relay such that said probe is connected through said voltage dropping relay to said reference voltage when said relay is in the de-energized position;
 a clamp circuit means connected to the output of said voltage comparator to maintain said output between precise limits;
 an AND-logic element having two inputs and an output, one of said inputs being connected to the output of said voltage comparator and the other of said inputs being connected to receive said chuck up signal;
 a third monostable multivibrator responsive to the output of said AND-logic element for generating a pulse output of a predetermined duration;
 a bistable multivibrator having a set input, a reset input and two outputs, said set input responsive to the output of said third monostable multivibrator;
 first means, responsive to one of said bistable multivibrator outputs, for applying an energizing output through said relay coil;
 second means responsive to the other of said bistable multivibrator outputs, for providing an output to said test sequencer;
 a fourth monostable multivibrator responsive to said chuck up signal for generating a pulse to reset said bistable multivibrator.

\* \* \* \* \*